US007307015B2

(12) United States Patent
Lee

(10) Patent No.: US 7,307,015 B2
(45) Date of Patent: Dec. 11, 2007

(54) METHOD FOR FORMING AN INTERCONNECTION LINE IN A SEMICONDUCTOR DEVICE

(75) Inventor: Date-Gun Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 314 days.

(21) Appl. No.: 11/181,275

(22) Filed: Jul. 13, 2005

(65) Prior Publication Data

US 2006/0014382 A1 Jan. 19, 2006

(30) Foreign Application Priority Data

Jul. 13, 2004 (KR) ...................... 10-2004-0054325

(51) Int. Cl.
*H01L 21/4763* (2006.01)

(52) U.S. Cl. ...................... 438/638; 438/623; 438/624; 438/702; 257/E21.579

(58) Field of Classification Search ........ 438/622–624, 438/637–638, 701–703; 257/E21.577, E21.579
See application file for complete search history.

(56) References Cited

U.S. PATENT DOCUMENTS 6,323,123 B1 * 11/2001 Liu et al. .................... 438/638
6,815,331 B2 * 11/2004 Lee et al. ................... 438/622

FOREIGN PATENT DOCUMENTS

KR 1020000048049 A 7/2000
KR 1020010021422 A 3/2001

OTHER PUBLICATIONS

Horiba, Shinichi, Semiconductor Memory Device and its Manufacture, English Abstract of Korean Patent Abstract 1020010021422 A, Mar. 15, 2001, Korean Intellectual Property Office, Republic of Korea.

Yokoyama, Dakasi, Semiconductor Apparatus and Method for the Same, English Abstract of Korean Patent Abstract 1020000048049 A, Jul. 25, 2000, Korean Intellectual Property Office, Republic of Korea.

Horiba, Shinichi, Semiconductor Memory Device and its Manufacture, Supplemental Copy of Drawings for Korean Patent Publication 1020010021422 A, Mar. 15, 2001, Korean Intellectual Property Office, Republic of Korea.

* cited by examiner

*Primary Examiner*—Thanhha S. Pham
(74) *Attorney, Agent, or Firm*—Andrew D. Fortney

(57) ABSTRACT

The CD uniformity of a damascene pattern and the reliability of interconnection lines may be enhanced when a semiconductor device is manufactured by a method including: forming a first insulating layer on a semiconductor substrate, the first insulating layer having a contact hole partially exposing the substrate; forming a photoresist layer filling the contact hole; removing the photoresist layer such that the first insulating layer is exposed and a recess is formed in the contact hole; reducing, removing or substantially eliminating the recess by removing an upper portion of the first insulating layer; forming a second insulating layer having a trench exposing the photoresist layer and a portion of the first insulating layer adjacent thereto; and removing the remaining photoresist layer.

15 Claims, 5 Drawing Sheets

39
38
37
35
34
33
31
30
32

METHOD FOR FORMING AN INTERCONNECTION LINE IN A SEMICONDUCTOR DEVICE

CROSS-REFERENCE TO RELATED APPLICATION

This application claims priority to and the benefit of Korean Patent Application 10-2004-0054325 filed in the Korean Intellectual Property Office on Jul. 13, 2004, the entire contents of which are incorporated herein by reference.

BACKGROUND OF THE INVENTION (a) Field of the Invention

The present invention relates to a method for manufacturing a semiconductor device. More particularly, the present invention relates to a method for forming an interconnection line in a semiconductor device.

(b) Description of the Related Art

Generally, wiring technology refers to a technology for realizing interconnections, power supplying routes, and signal transmission routes in an integrated circuit (IC). Conventionally, aluminum (Al) has been widely used as a line material. However, line resistance and contact resistance has increased as line widths decrease according to trends of higher integration and higher speeds in semiconductor devices. Therefore, copper (Cu) lines have been actively researched for those reasons and to address the problem of electromigration (EM).

Copper shows resistivity lower than aluminum by about 62%, and it shows better strength against electromigration. Therefore, better reliability may be obtained from copper lines especially for a semiconductor device of high integration and high speed.

On the other hand, copper is difficult to dry-etch in comparison with aluminum. Therefore, copper interconnection lines generally have to be formed by a dual damascene process by which a damascene pattern including a contact hole and a trench is formed in an interlayer insulating layer.

Such a conventional method for forming interconnection lines will now be described with reference to FIG. 1A to FIG. 1E. In FIG. 1A to FIG. 1E, only a part of a semiconductor device has been shown in cross-sectional views, and it should be understood that a semiconductor device may include a plurality of parts having the same schematic sectional structure.

As shown in FIG. 1A, lower interconnection lines 12 insulated by a lower interlayer insulating layer 11 are formed on a semiconductor substrate 10. A first etch stop layer 13 and a first interlayer insulating layer 14 are sequentially deposited on such a semiconductor substrate 10. The first etch stop layer 13 has high etch selectivity with respect to the first interlayer insulating layer 14, and it may comprise a nitride layer, e.g., $Si_3N_4$. The first interlayer insulating layer 14 may comprise an oxide layer, e.g., $SiO_2$ formed by plasma deposition from a $SiH_4$ source gas.

Subsequently, a contact hole partially exposing the lower interconnection line 12 is formed by sequentially patterning the first interlayer insulating layer 14 and the first etch stop layer 13 by photolithography and dry etching. Then, a photoresist layer 15 is formed on the first interlayer insulating layer 14 so as to fill the contact hole.

Then, as shown in FIG. 1B, the photoresist layer 15 on the first interlayer insulating layer 14 is etched back to the degree that the first interlayer insulating layer 14 is exposed.

In this case, the photoresist layer 15 within the contact hole is partially removed such that a recess 16 may be formed at a top thereof.

Subsequently, as shown in FIG. 1C, the second etch stop layer 17 is deposited on the first interlayer insulating layer 14 to fill the recess 16, and then the second interlayer insulating layer 18 is deposited on the second etch stop layer 17.

The same as the first etch stop layer 13, the second etch stop layer 17 may comprise a nitride layer, e.g., $Si_3N_4$. The same as the first interlayer insulating layer 14, the second interlayer insulating layer 18 may comprise an oxide layer, e.g., $SiO_2$ deposited from a $SiH_4$ source gas.

Subsequently, a trench 19 is formed by patterning the second interlayer insulating layer 18 by photolithography and etching. The trench 19 has a bigger size (e.g., a larger width) than the contact hole such that the second etch stop layer 17 may be partially exposed at positions above and adjacent to the photo resist 15.

Then, as shown in FIG. 1D, a damascene pattern 20 including the contact hole and the trench 19 is formed by sequentially removing the exposed second etch stop layer 17 and the photoresist layer 15. Then, as shown in FIG. 1E, a copper layer is deposited on the second interlayer insulating layer 18 and in the contact hole by an electroplating method such that the damascene pattern 20 is filled. Although not shown in the drawings, a diffusion barrier may be first formed in the damascene pattern 20 (i.e., on the second interlayer insulating layer 18 and before the copper layer) such that the diffusion of copper into adjacent and/or underlying layers may be blocked.

Then, a chemical mechanical polishing (CMP) process is performed to remove an upper portion of the copper layer such that the copper layer may be divided by the second interlayer insulating layer 18 (i.e., all copper outside of the damascene pattern 20 in FIG. 1D is removed). By such a CMP process, an upper interconnection line 21 contacting the lower interconnection line 12 is formed, and at the same time the top surface is planarized.

A depth of the recess 16 (formed by etching back the photoresist layer 15) influences the photolithography process for forming the trench 19, on which a critical dimension (CD) of the trench 19 depends. Therefore, uniformity in depths of the recesses 16 takes an important role in obtaining sufficient CD uniformity of the damascene pattern 20.

However, a region having high pattern density and a region having relatively low pattern density may show differences in etching speed during etch back of the photoresist layer 15. As a result, the recess 16 is formed deeper in the region having high pattern density as shown in FIG. 2A, and shallower in the region having low pattern density as shown in FIG. 2B. Therefore, a recess depth difference occurs between regions of different pattern densities. Consequently, the CD of the damascene pattern 20 becomes higher in the region having higher pattern density, and CD of the damascene pattern 20 becomes lower in the region having lower pattern density. Such a non-uniformity of CD causes a deterioration of the interconnection lines.

The above information disclosed in this Background section is only for enhancement of understanding of the background of the invention, and therefore, it may contain information that does not form information that may be already known in this country to a person of ordinary skill in the art.

SUMMARY OF THE INVENTION

The present invention has been made in an effort to provide a semiconductor device and a manufacturing method thereof that enhances CD uniformity of a damascene pattern and reliability of interconnection lines.

An exemplary method for forming an interconnection line in a semiconductor device according to an embodiment of the present invention includes: forming a first insulating layer on a semiconductor substrate, the first insulating layer having a contact hole therein partially exposing the substrate; forming a photoresist layer filling the contact hole; removing a sufficient portion of the photoresist layer to expose the first insulating layer and form a recess in the contact hole; removing a sufficient portion of the first insulating layer to reduce or remove the recess and/or render the photoresist layer substantially (e.g., at least partially) coplanar with the first insulating layer; forming a second insulating layer having a trench therein exposing the photoresist layer and a portion of the first interlayer insulating layer adjacent thereto; and removing the remaining photoresist layer.

DETAILED DESCRIPTION OF THE EMBODIMENTS

An embodiment of the present invention will hereinafter be described in detail with reference to the accompanying drawings.

FIG. 3A to FIG. 3F are sectional views showing sequential stages of a method for forming an interconnection line in a semiconductor device according to an exemplary embodiment of the present invention.

Figure 1A:
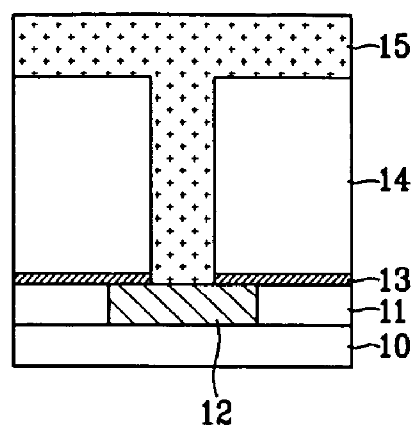
FIG. 1A to FIG. 1E are sectional views showing sequential stages of a conventional method for forming an interconnection line in a semiconductor device.
Figure 1B:
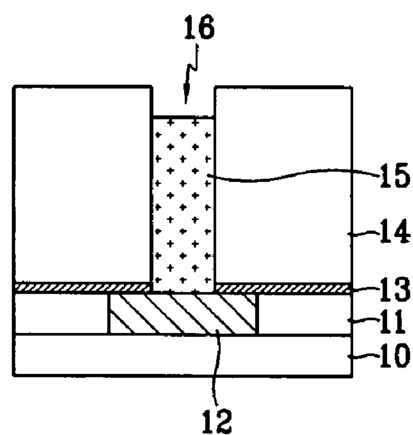
Figure 1C:
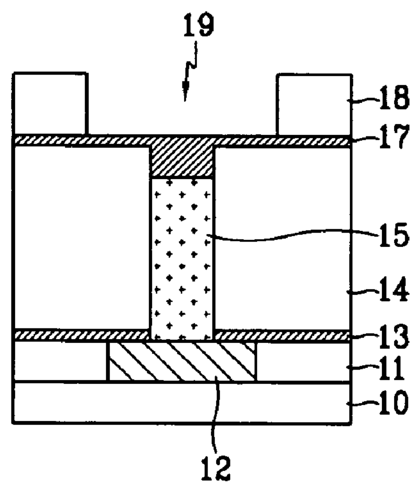
Figure 1D:
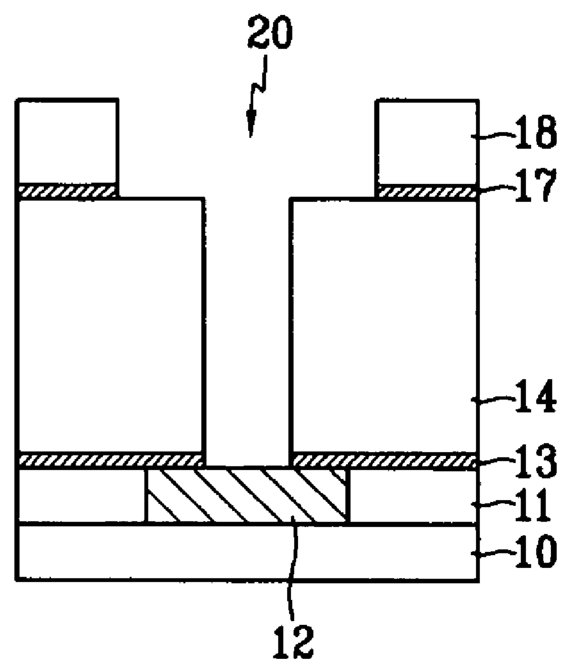
Figure 1E:
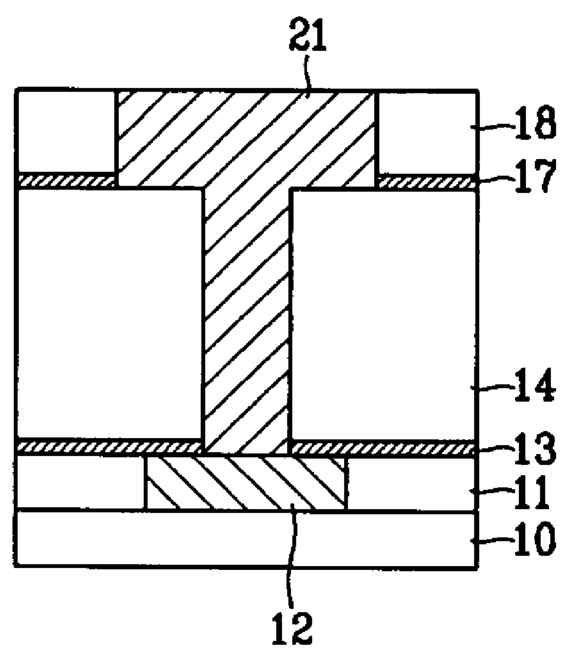
Figure 2A:
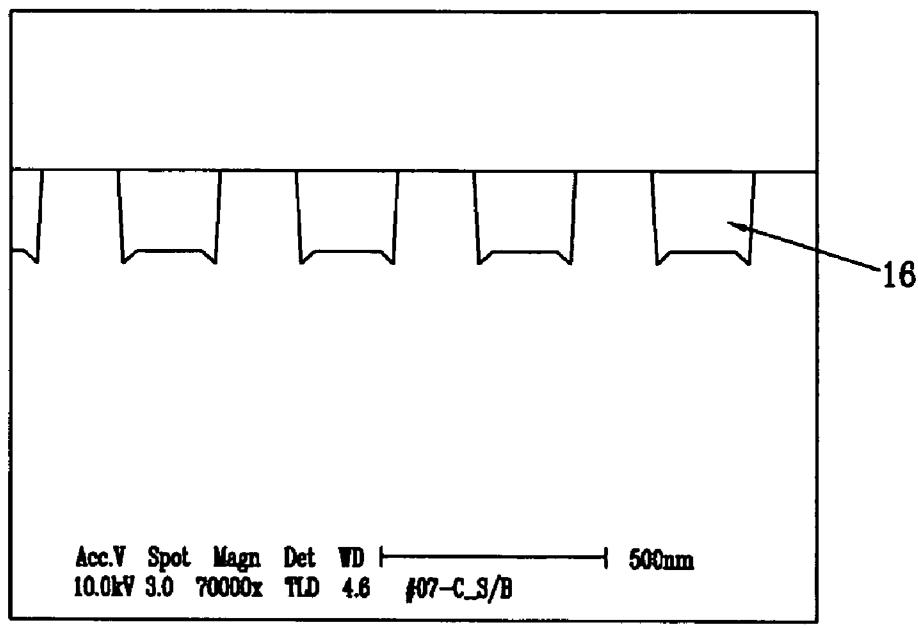
FIG. 2A and FIG. 2B shows height difference of a recess formed in a photoresist layer remaining in a contact hole between regions of higher and lower pattern density when interconnection lines are formed according to a conventional method.
Figure 2B:
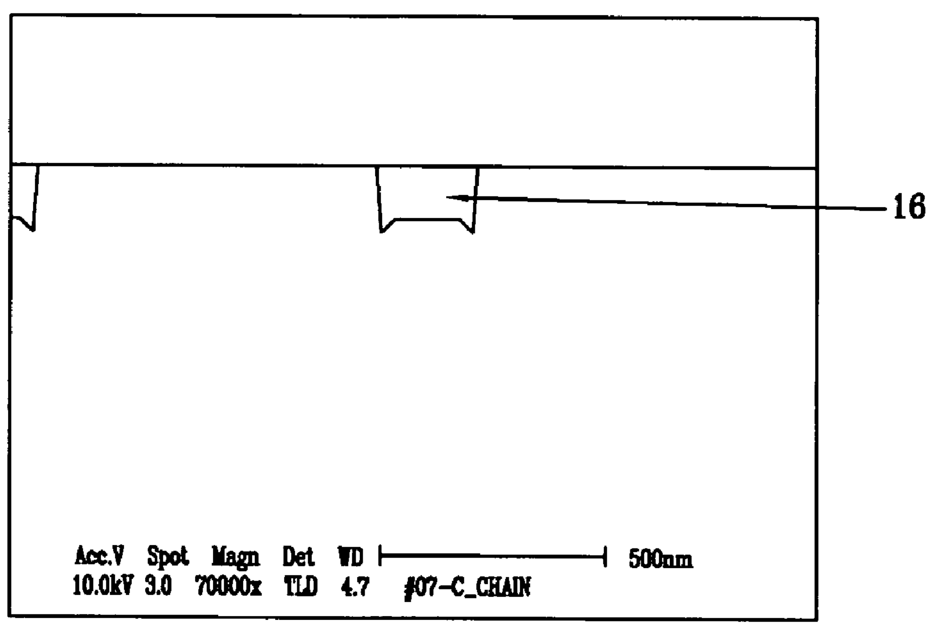
Figure 3A:
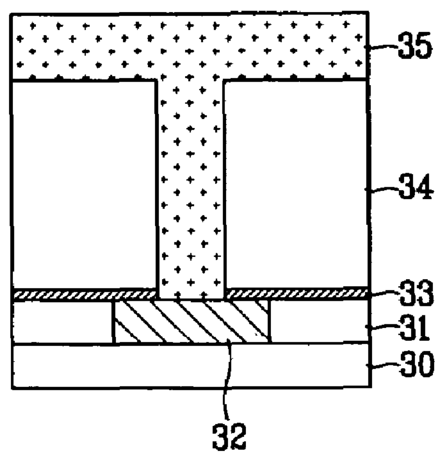
FIG. 3A to FIG. 3F are sectional views showing sequential stages of a method for forming an interconnection line in a semiconductor device according to an exemplary embodiment of the present invention.

As shown in FIG. 3A, lower interconnection lines 32 insulated by a lower interlayer insulating layer 31 are formed on a semiconductor substrate 30. A first etch stop layer 33 and a first interlayer insulating layer 34 are sequentially deposited on lower interconnection lines 32 and lower interlayer insulating layer 31 on semiconductor substrate 30.

The first etch stop layer 33 generally has a higher etch selectivity (e.g., a lower etch rate than the first interlayer insulating layer 34) under the conditions for etching the first insulating layer 34, and it may comprise a nitride layer (e.g., $Si_3N_4$). The first interlayer insulating layer 34 may comprise one or more oxide layers (e.g., $SiO_2$ from a $SiH_4$ source gas and an oxygen source gas, such as $O_2$, $O_3$, etc., to form USG). The first interlayer insulating layer 34 may further comprise a dopant (e.g., fluorine from a fluorine source gas such as $SiF_4$ to form FSG, or boron and/or phosphorous) or a doped oxide layer (e.g., in a conventional USG/FSG/USG stack).

Subsequently, a contact hole partially exposing the lower interconnection line 32 is formed by sequentially patterning the first interlayer insulating layer 34 (e.g., by photolithography) and etching the first etch stop layer 33 and the first etch stop layer 33 (generally in sequential steps involving different etch chemistries, although the two sequential etch steps can be performing in the same chamber without interruption). Then, a photoresist layer 35 is formed on the first interlayer insulating layer 34 so as to fill the contact hole.

Figure 3B:
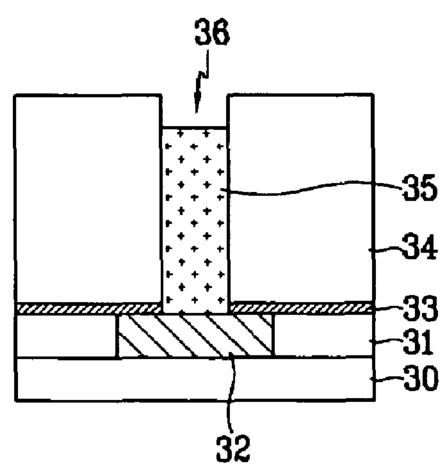

Then, as shown in FIG. 3B, the photoresist layer 35 on the first interlayer insulating layer 34 is etched back sufficiently to expose the first interlayer insulating layer 34. In this case, the photoresist layer 35 within the contact hole is partially removed, resulting in formation of a recess 36 at a top (or exposed part) of the contact hole.

Figure 3C:
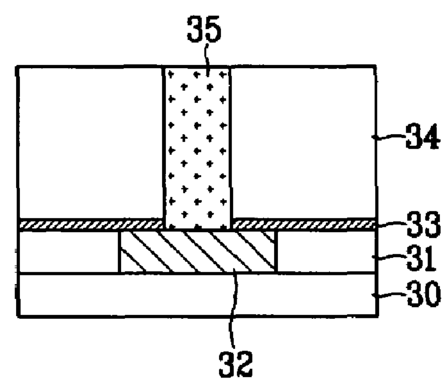

Subsequently, as shown in FIG. 3C, a top surface of the first interlayer insulating layer 34 is planarized sufficiently to reduce, remove or eliminate the recess 36 (i.e., it fully disappears), generally by etching back the first interlayer insulating layer 34 above the photoresist layer 35. Since the oxide layer and the photoresist layer show etch selectivity of about 5:1 to 10:1, the first interlayer insulating layer 34 may be somewhat selectively removed by the etch back. Alternatively, the oxide layer may be planarized by polishing (e.g., chemical mechanical polishing).

The insulating layer etch back may comprise dry etching (or plasma etching) using a gas mixture comprising a carbon source (such as CO or $CO_2$), an oxygen source (such as $O_2$, $O_3$, $N_2O$, $NO_2$, or NO), and a fluorine source (e.g., a fluorocarbon of the formula $C_xH_yF_z$, where x is an integer of from 1 to 4, z is an integer of at least 3, and [y+z]=[2x+2] or when x is 3 or 4, 2x, such as $CF_4$, $C_2F_6$, $C_2H_2F_4$, or $C_4F_8$). Each of the carbon, oxygen or fluorine sources may contain one or more atoms providing a source of another element (e.g., the carbon source may contain oxygen atoms, and thus act as an oxygen source; the fluorine source may contain carbon atoms, and thus act as a carbon source; etc.). The insulating layer etch back gas mixture may further comprise an inert or noble gas, such as $N_2$, He, or Ar). A preferred gas mixture comprises $C_4F_8$, CO, $O_2$, and Ar.

The thickness of the first insulating layer 34 to be etched back may be determined empirically (e.g., by measuring or calculating the depths of the recesses 36, and calculating an etch back time from [i] the known etch rates of the first insulating layer 34 and photoresist layer 35 and [ii] the desired amount of recesses 36 to be removed or eliminated). In turn, one may overdeposit first insulating layer 34 to a thickness slightly greater than that ultimately desired or targeted.

An oxide layer etching apparatus of Tokyo Electronic Ltd. may be used as an etching apparatus in this step. In this case, a gap between the wafer and a head of the apparatus is adjusted to about 25 mm, the pressure adjusted to about 0 mtorr, the power adjusted to about 1700 W, and flow rates of $C_4F_8$, CO, $O_2$, and Ar gases respectively adjusted to about 12 sccm, 300 sccm, 50 sccm, and 8 sccm.

Figure 3D:
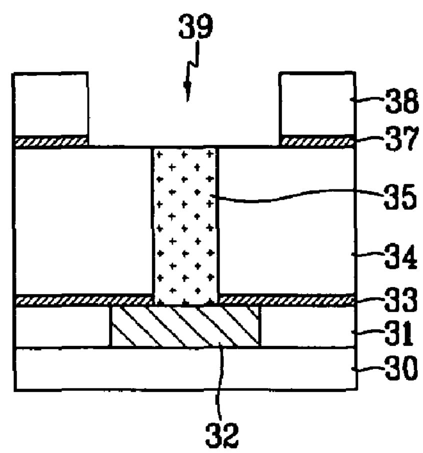

As shown in FIG. 3D, the second etch stop layer 37 and the second interlayer insulating layer 38 are sequentially deposited over the entire surface of the planarized substrate. The same as the first etch stop layer 33, the second etch stop layer 37 may comprise a nitride layer (e.g., $Si_3N_4$). The same as the first interlayer insulating layer 34, the second interlayer insulating layer 38 may comprise an oxide layer (e.g., $SiO_2$ plasma deposited from a $SiH_4$ source gas).

Subsequently, a trench 39 is formed by sequentially patterning the second interlayer insulating layer 38 (e.g., by photolithography) and etching the second insulating layer 38 and the second etch stop layer 37. Generally, the etch process and etch chemistries for etching the second insulating layer 38 and the second etch stop layer 37 are the same as for the first insulating layer 34 and the first etch stop layer 33. The trench 39 has a bigger size (e.g., a larger width) than the contact hole such that the photoresist layer 35 and a portion of the first interlayer insulating layer 34 adjacent thereto may be exposed.

Figure 3E:
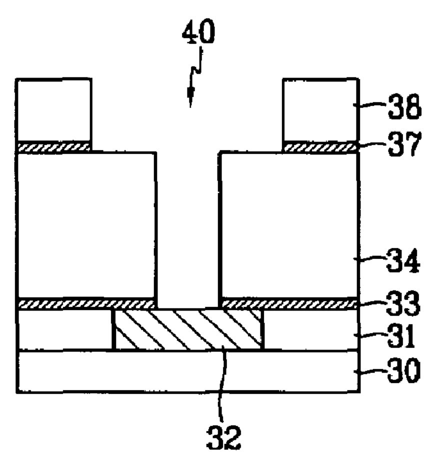

Then, as shown in FIG. 3E, a damascene pattern 40 including the contact hole and the trench 19 is formed by removing the remaining portion of the photoresist layer 35. The remaining portion of the photoresist layer 35 is removed conventionally (e.g., by plasma ashing or wet developing).

Figure 3F:
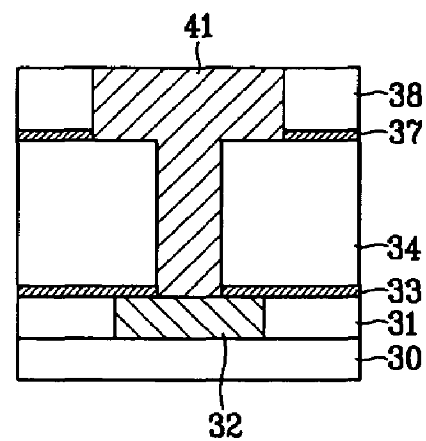

Then, as shown in FIG. 3F, a copper layer is deposited on the second interlayer insulating layer 38 (generally by an electroplating method such that the damascene pattern 40 (both the trench and the contact hole) is filled. Although not shown in the drawings, a diffusion barrier may be interposed between the copper layer and the second interlayer insulating layer 38 (i.e., formed before deposition of the copper layer) such that the diffusion of atoms into and/or out from the copper layer may be blocked. Such a diffusion barrier layer may comprise a metal nitride (e.g., TaN or TiN), formed by a conventional CVD method or metal sputtering followed by annealing in a nitrogen-containing atmosphere (e.g., containing $N_2$ or $NH_3$), and may further comprise a thin underlying adhesion layer (e.g., Ta and/or Ti), generally formed by sputtering.

Then, CMP or other planarization process is performed to remove an upper portion of the copper layer (e.g., outside the damascene pattern 40), generally such that the copper layer may be divided by the second interlayer insulating layer 38. By such a CMP process, an upper interconnection line 41 contacting the lower interconnection line 32 is formed, and at the same time the top surface is planarized.

As described above, according to an exemplary embodiment of the present invention, recesses resulting from etch back of the photoresist layer are generally removed, and thus a recess depth difference is not caused between regions having higher and lower pattern densities. Therefore, the CD uniformity of a damascene pattern is enhanced, and reliability of interconnection lines is improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming an interconnection line in a semiconductor device, comprising:

forming a first insulating layer on a semiconductor substrate, the first insulating layer having a contact hole therein partially exposing the substrate;

forming a photoresist layer filling the contact hole;

removing a portion of the photoresist layer sufficient to expose the first insulating layer and form a recess in the contact hole;

removing a portion of the first insulating layer sufficient to reduce, remove or eliminate the recess;

forming a second insulating layer having a trench therein exposing the photoresist layer and a portion of the first insulating layer adjacent thereto; and removing the photoresist layer.

2. The method of claim 1, further comprising:

forming a first etch stop layer on or over the semiconductor substrate, before forming the first insulating layer; and forming a second etch stop layer on or over the first insulating layer, before forming the second insulating layer.

3. The method of claim 2, wherein:

the first and second insulating layers each comprise an oxide layer; and the first and second etch stop layers each comprise a nitride layer.

4. The method of claim 3, wherein removing the portion of the first insulating layer comprises dry etching with a gas mixture comprising a carbon source, an oxygen source, and a fluorine source.

5. The method of claim 4, wherein the gas mixture further comprises an inert or noble gas.

6. The method of claim 4, wherein the fluorocarbon comprises $C_4F_8$.

7. The method of claim 3, wherein removing the first insulating layer comprises dry etching using a gas mixture comprising CO, $O_2$, Ar, and $C_4F_8$.

8. The method of claim 1, wherein the dry etching is performed using an oxide etching apparatus.

9. The method of claim 1, wherein removing the first insulating layer further comprises substantially removing the recess.

10. The method of claim 1, wherein removing the first insulating layer further comprises rendering the photoresist layer substantially coplanar with the first insulating layer.

11. The method of claim 1, wherein removing portion of the first insulating layer comprises etching back the first insulating layer selectively relative to the photoresist layer.

12. The method of claim 11, wherein the first insulating layer is etched back at a rate at least five times greater than the photoresist layer.

13. The method of claim 1, further comprising depositing a copper layer in the trench and contact hole, after removing the photoresist layer.

14. The method of claim 1, wherein the first insulating layer is formed to a thickness greater than an ultimate target thickness.

15. The method of claim 1, wherein the semiconductor substrate comprises an underlying metal line and an underlying insulator layer.

* * * * *